(12) United States Patent
Jung

(10) Patent No.: US 7,605,038 B2
(45) Date of Patent: Oct. 20, 2009

(54) SEMICONDUCTOR DEVICE AND MANUFACTURING METHOD THEREOF

(75) Inventor: Jin Hyo Jung, Boocheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 11/779,954

(22) Filed: Jul. 19, 2007

(65) Prior Publication Data

US 2008/0017921 A1    Jan. 24, 2008

(30) Foreign Application Priority Data

Jul. 19, 2006    (KR) ...................... 10-2006-0067601

(51) Int. Cl.
*H01L 21/8234*    (2006.01)

(52) U.S. Cl. ...................... 438/275; 438/305; 257/344; 257/E21.409

(58) Field of Classification Search ................ 438/275, 438/305; 257/344, E21.409
See application file for complete search history.

(56) References Cited

U.S. PATENT DOCUMENTS 4,769,686 A * 9/1988 Horiuchi et al. ............. 257/373
6,265,274 B1 * 7/2001 Huang et al. ................ 438/305
2002/0098652 A1 * 7/2002 Mori et al. .................. 438/258
2007/0010052 A1 * 1/2007 Huang et al. ................ 438/199

* cited by examiner

*Primary Examiner*—Michelle Estrada
*Assistant Examiner*—Jarrett J Stark
(74) *Attorney, Agent, or Firm*—Saliwanchik, Lloyd & Saliwanchik

(57) ABSTRACT

A high voltage semiconductor deice and a manufacturing method thereof are provided. The high voltage semiconductor device comprises: second conductive type drift regions disposed spaced from each other on a first conductive type well region formed on a first conductive type semiconductor substrate; a gate electrode on a channel region between the second conductive type drift regions with a gate insulating film disposed therebetween; second conductive type high-concentration source and drain each disposed in the second conductive type drift regions, spaced from a side of a gate electrode; a gate spacer having a spacer part covering the side of the gate electrode and a spacer extending part to cover a spaced portion of the second conductive type high-concentration source and drain from the side of the gate electrode; and a silicide formed on the gate electrode and the second conductive type high-concentration source and drain.

13 Claims, 4 Drawing Sheets

SEMICONDUCTOR DEVICE AND MANUFACTURING METHOD THEREOF

CROSS-REFERENCE TO RELATED APPLICATION

The present application claims the benefit under 35 U.S.C. §119 of Korean Patent Application No. 10-2006-0067601, filed Jul. 19, 2006, which is hereby incorporated by reference in its entirety.

BACKGROUND

High voltage semiconductor devices are used for applications in fields such as communication, home appliances, and cars.

High voltage semiconductor devices are susceptible to problems where when a photoresist pattern for a silicide blocking pattern is formed at a portion deviating from a designated position, or a dimension of the photoresist pattern is smaller or larger than a designated dimension, the silicide is formed at an unwanted portion, causing a serious defect in the semiconductor device.

BRIEF SUMMARY

Embodiments of the present invention provide a high voltage semiconductor device incorporating a self-aligned silicide. The self-aligned silicide can be formed on the gate electrode and the source and drain regions by using an L-shaped gate spacer.

A high voltage semiconductor device according to an embodiment comprises: second conductive type drift regions disposed spaced from each other on a first conductive type well region formed on a first conductive type semiconductor substrate; a gate electrode on a gate insulating film disposed on a channel region between the second conductive type drift regions in the first conductive type well region; second conductive type high-concentration sources and drains each disposed in the second conductive type drift regions, spaced a distance from a side of the gate electrode, and implanted with high concentration ions; a gate spacer having a spacer part along the sidewall of the gate electrode and a spacer extending part extended to cover the spaced distance portion from the side of the gate electrode to the second conductive type high-concentration sources and drains; and a silicide formed on the gate electrode, the second conductive type high-concentration source and the second conductive type high-concentration drain.

A manufacturing method of a high voltage semiconductor device according to another embodiment comprises: forming second conductive type drift regions disposed spaced from each other on a first conductive type well region formed on a first conductive type semiconductor substrate; forming a gate electrode on a channel region between the second conductive type drift regions in the first conductive type well region with a gate insulating film disposed therebetween; forming an insulating film covering the second conductive type drift regions and the gate electrode; forming a photoresist pattern on the insulating film covering a side surface of the gate electrode to a portion of the second conductive type drift regions from the side; forming a gate spacer having a spacer part covering the side of the gate electrode and a spacer extending part extended from the spacer part by patterning the insulating film using the photoresist pattern as an etch mask; forming a second conductive type high-concentration source and a second conductive type high-concentration drain by implanting a second conductive type ion in the second conductive type drift regions using the gate spacer as an implantation mask; and forming a silicide in the second conductive type high-concentration source and the second conductive type high-concentration drain.

A manufacturing method of a semiconductor device having a high voltage region and a low voltage region according to another embodiment comprises: forming a device isolating layer isolating a high voltage region and a low voltage region on a semiconductor substrate; forming a first gate insulating film pattern on the semiconductor substrate in the high voltage region and a first gate electrode on the first gate insulating film pattern, and forming a second gate insulating film pattern on the semiconductor substrate in the low voltage region and a second gate electrode on the second gate insulating film pattern; forming a LDD region by covering the high voltage region with a first photoresist pattern and implanting ions in the low voltage region; removing the first photoresist pattern; forming an insulating film to cover the high voltage region and the low voltage region; forming a second photoresist pattern on the insulating film and covering one side of the first gate electrode and a portion of the semiconductor substrate adjacent the one side thereof and the other side of the first gate electrode and a portion of the semiconductor substrate adjacent the other side thereof; forming a first gate spacer surrounding both sides of the first gate electrode and the portion of the semiconductor substrate and a second gate spacer surrounding both sides of the second gate electrode by etching the insulating film using the second photoresist pattern as a mask; forming a first source and drain region in the high voltage region and the second source and drain region in the low voltage region by ion-implanting over the semiconductor substrate at high concentration; forming a metal film over the semiconductor substrate; and forming a silicide on the first source and drain region, the first gate electrode, and the second source and drain region by performing a rapid thermal processing of the semiconductor substrate.

Other systems, methods, features and advantages will be, or will become, apparent to one with skill in the art upon examination of the following figures and detailed description. Nothing in this section should be taken as a limitation on those claims. Further aspects and advantages are discussed below in conjunction with the embodiments.

DETAILED DESCRIPTION

Hereinafter, a high voltage semiconductor device according to embodiments of the present invention will be described in more detail with reference to the accompanying drawings.

Figure 1:
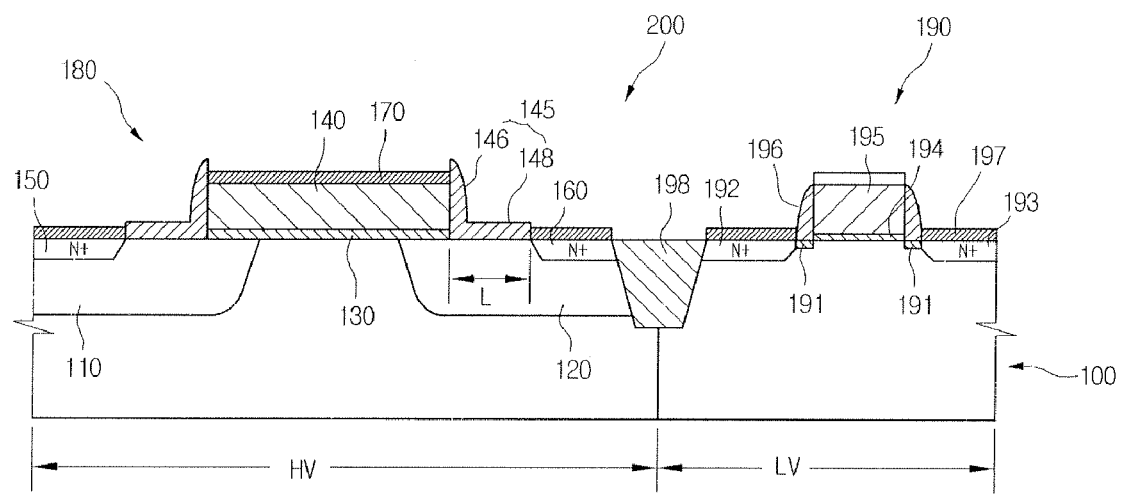
FIG. 1 is a cross-sectional view showing a high voltage semiconductor device according an embodiment.

FIG. 1 is a cross-sectional view showing a high voltage semiconductor device according one embodiment.

Referring to FIG. 1, the high voltage semiconductor device 200 includes a first conductive type semiconductor substrate 100, a second conductive type drift region 110 and 120, a high voltage gate insulating pattern 130, a high voltage gate electrode 140, a second conductive type high-concentration source 150, a second conductive type high-concentration drain 160, a high voltage gate L-shaped spacer 145, and a silicide 170.

Referring to FIG. 1, the first conductive type semiconductor substrate 100 can include, for example, a first conductive type well region on a pure silicon substrate, for example, P type impurity such as boron (B), which is group III element can be used as the first conductive type element. In an embodiment, the first conductive type semiconductor substrate 100 can be divided into a high voltage region (HV region) and a low voltage region (LV region).

The HV region of the first conductive type semiconductor substrate 100 can be provided with a high voltage semiconductor device 180 and the LV region of the first conductive type substrate 100 can be provided with a low voltage semiconductor device 190.

The second conductive type drift regions 110 and 120 are disposed in the HV region of the first conductive type semiconductor substrate 100. In one embodiment, the second conductive type drift regions 110 and 120 are formed spaced from each other at a predetermined spacing in the HV region of the first conductive type semiconductor substrate 100. The region between the second conductive type drift regions 110 and 120 is defined as a channel region (CR).

The second conductive type drift regions 100 and 120 can include N type impurity such as phosphorus (P). The second conductive type drift regions 110 and 120 can be doped with the N type impurity at a low concentration, and the junction depth of the second conductive type drift regions 110 and 120 is formed at a relatively deep depth to be able to receive high voltage.

A high voltage gate insulating film pattern 130 is disposed on the HV region of the first conductive type semiconductor substrate 100. Specifically, the high voltage gate insulating film pattern 130 is formed a portion corresponding to the channel region CR formed between the second conductive type drift regions 110 and 120 in the HV region. The high voltage gate insulating film pattern 130 has a proper thickness so as to not cause insulation breakdown due to the high voltage applied to the high voltage gate electrode 140 and the high voltage applied to the second conductive type high-concentration drain 160.

The high voltage gate electrode 140 is disposed on the high voltage gate insulating film pattern 130. The high voltage gate electrode 140 can include polysilicon, for example.

The second conductive type high concentration source 150 is formed in the second conductive type drift region 110 spaced a designated length L from the high voltage gate insulating pattern 130. In an embodiment, the length L can be, for example, 0.4 µm to 0.6 µm. In one embodiment, the length L is 0.5 µm. The second conductive type high-concentration source 150 includes, for example, N type impurity such as phosphorus (P) as the second conductive type element. The second conductive type high-concentration source 150 can be formed at the surface of the second conductive type drift region 110.

The second conductive type high-concentration drain 160 is formed in the second conductive type drift region 110 spaced a designated length L from the high voltage gate insulating pattern 130. The second conductive type high-concentration drain 160 includes, for example, N type impurity such as phosphorus (P) as the second conductive type element. The second conductive type high-concentration drain 160 can be formed at the surface of the second conductive type drift region 120.

The high voltage gate spacer 145 covers an exposed portion between the high voltage gate electrode 140 and the second conductive type high-concentration source 150 in the second conductive type drift region 110 and an exposed portion between the high voltage gate electrode 140 and the second conductive type high-concentration drain 160.

Each high voltage L-shaped gate spacer 145 having the arrangement as described above includes a spacer part 146 and a spacer extending part 148. In an embodiment, the high voltage L-shaped gate spacer 145 can include, for example, oxide or nitride.

The spacer part 146 covers an exposed side of the high voltage gate electrode 140 and a top portion of the spacer part 146 extends higher than the upper surface of the high voltage gate electrode 140. The spacer extending part 148 extends from the spacer part 146 toward the second conductive type high-concentration source 150 at one side of the gate electrode 140, and extends from the spacer part 146 toward the second conductive type high-concentration drain 160 at the other side of the gate electrode 140 so that a portion of the second conductive type drift region 110 between the high voltage gate electrode 140 and the second conductive type high-concentration source 150 and a portion of the second conductive type drift region 120 between the high voltage gate electrode 140 and the second conductive type high-concentration drain 160 are covered. In an embodiment, the thickness of the spacer extending part can be, for example, 800 Å to 1,200 Å. In one embodiment, the thickness of the spacer extending part is 1,000 Å.

A silicide 170 can be formed on the second conductive type high-concentration source 150, the high voltage gate electrode 140, and the second conductive type high-concentration drain 160. The silicide 170 can be formed from, for example, nickel (Ni), titanium (Ti), or Cobalt (Co). The silicide 170 can be formed in a self align manner using the high voltage L-shaped gate spacer 145.

Referring to FIG. 1, the low voltage semiconductor device 190 is formed in the LV region of the first conductive type semiconductor substrate 100. In an embodiment, the low voltage semiconductor device 190 and the high voltage semiconductor device 180 are electrically isolated by means of a device isolating structure 198.

The low voltage semiconductor device 190 can include a LDD region 191, a second conductive type high-concentration source 192, a second conductive type high-concentration drain 193, a low voltage gate insulating pattern 194, a low voltage gate electrode 195, a low voltage gate spacer 196, and a silicide 197.

The second conductive type high-concentration source 150 of the high voltage semiconductor device 180 and the second conductive type high-concentration source 192 of the low voltage semiconductor device 190 are electrically connected to respective source electrodes, and the second conductive type high-concentration drain 160 of the high voltage semiconductor device 180 and the second conductive type high-concentration drain 192 of the low voltage semiconductor device 190 are electrically connected to respective drain electrodes.

FIGS. 2 to 7 are cross-sectional views showing a manufacturing method of a high voltage semiconductor device according to an embodiment.

Figure 2:
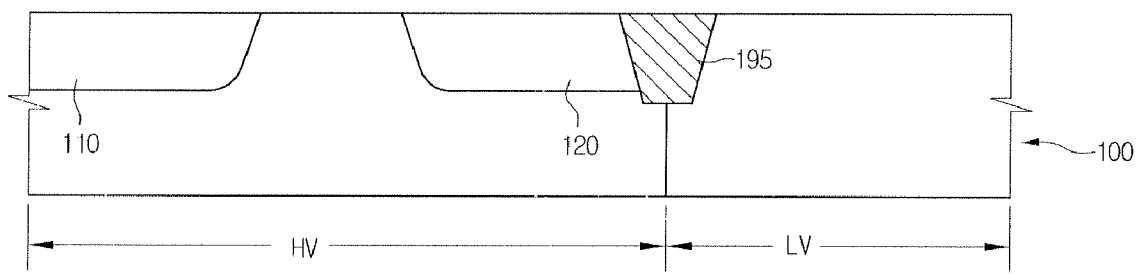
FIGS. 2 to 8 are cross-sectional views showing a manufacturing method of a high voltage semiconductor device according to an embodiment.

Referring to FIG. 2, a boundary between a high voltage (HV) region and a low voltage (LV) region can be formed on a substrate 100 using, for example, a device isolating structure 195.

Next, second conductive type drift regions 110 and 120 for a high voltage semiconductor device can be formed on the HV region. The second conductive type drift regions 110 and 120 can be formed by implanting second conductive type ions at low concentration into the first conductive type semiconductor substrate 100 and then rapidly diffusing them in a high temperature environment of about 1,100° C. in a short time. The second conductive type ions can be N type impurity such as phosphorus (P). At this time, the junction depth of the second conductive type drift region 110 and 120 is formed at a relatively deep depth to be able to receive an applied high voltage.

Figure 3:
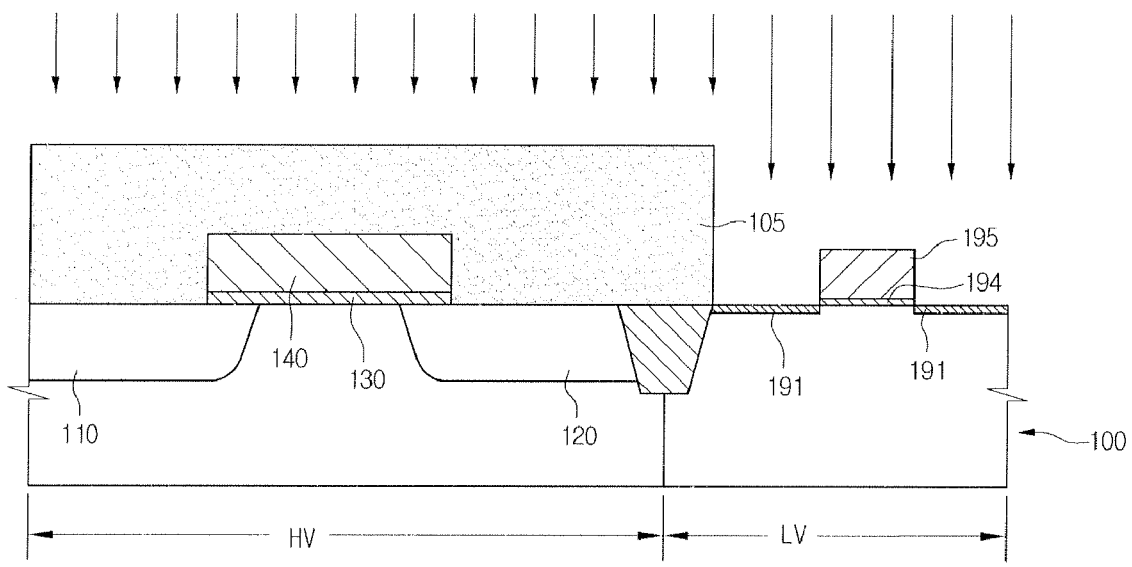

Referring to FIG. 3, a high voltage gate oxide film and a low voltage gate oxide film can be formed by oxidizing the HV region and the LV region of the first conductive type semiconductor substrate 100 through a rapid thermal processing (RTP). At this time, the high voltage gate oxide film has a first thickness and the low voltage gate oxide film has a second thickness thinner than the first thickness. In one embodiment, prior to forming the low voltage oxide film, the region where the low voltage oxide film is formed can selectively be implanted with impurity such as nitrogen.

A high voltage gate insulating pattern 130 and a low voltage gate insulating film pattern 194 can be formed by patterning the high voltage gate oxide film and the low voltage gate oxide film using a photo process.

Next, a gate polysilicon film can be formed to cover the high voltage gate insulating film pattern 130 and the low voltage gate insulating pattern 195. In an embodiment, the gate polysilicon film can be formed, for example, using a chemical vapor deposition process.

After the gate polysilicon film is formed, a high voltage gate electrode 140 and a low voltage gate electrode 195 can be formed by patterning the gate polysilicon using a photolithography process.

Subsequently, the HV region is covered with the photoresist pattern 105 and the LV region is ion-implanted with a second conductive type element, for example, N type impurity such as phosphorous (P) at the low concentration to form a lightly doped drain (LDD) region 191 in the LV region.

After forming the LDD region 191 in the LV region, the photoresist pattern 105 covering the HV region is removed. The photoresist pattern 105 can be removed using, for example, etchant and oxygen plasma that removes the photoresist.

Figure 4:
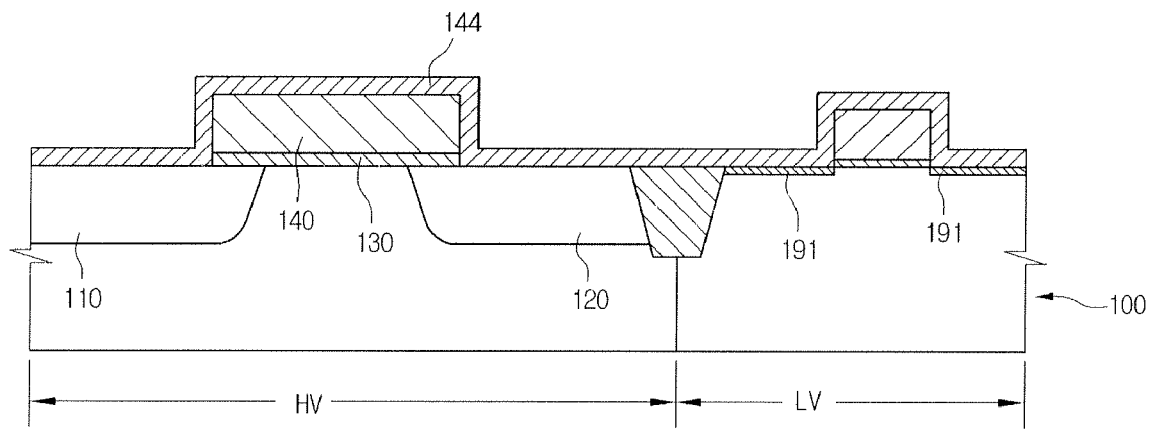

Referring to FIG. 4, after the photoresist pattern 105 of FIG. 3 is removed, an insulating film 144 is formed on the substrate 100 covering the HV region and the LV region. In an embodiment, the insulating film 144 can be an oxide film or a nitride film. In another embodiment, the insulating film 144 can be a double film of an oxide film and a nitride film. In one embodiment, the insulating film 144 can be formed to a thickness of about 800 Å to about 1,200 Å.

Figure 5:
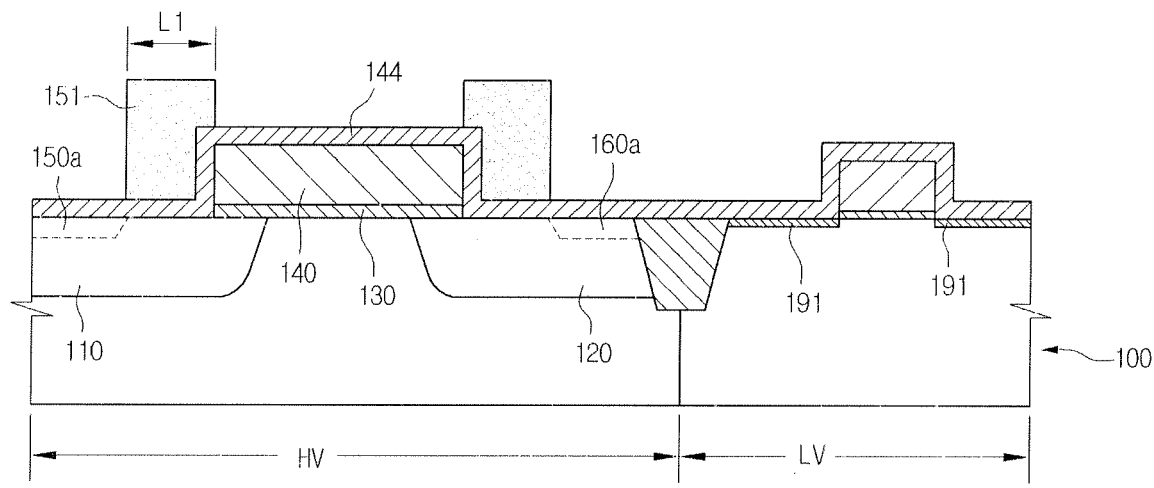

Referring to FIG. 5, after the insulating film 144 is formed, another photoresist pattern 151 is formed on the insulating film 144. The photoresist pattern 151 is formed to cover sidewalls of the high voltage gate electrode 140 and have a width that also covers a portion of the second conductive type drift region 110, 120 adjacent the sidewall. At this time, the width L1 of the photoresist pattern 151 can be about 0.4 μm to about 0.6 μm.

As illustrated in FIG. 5, the reference numeral 150a indicated by a dotted line indicates a region where a second conductive type high-concentration source 150 is formed, and the reference numeral 160a indicated by a dotted line indicates a region where a second conductive type high-concentration drain 160 is formed.

The photoresist pattern 151 is formed between one side of the high voltage gate electrode 140 and the region 150a where the second conductive type high-concentration source 150 is to be formed and the other side of the high voltage gate electrode 140 and the region where the second conductive type high-concentration drain 160 is to be formed.

Figure 6:
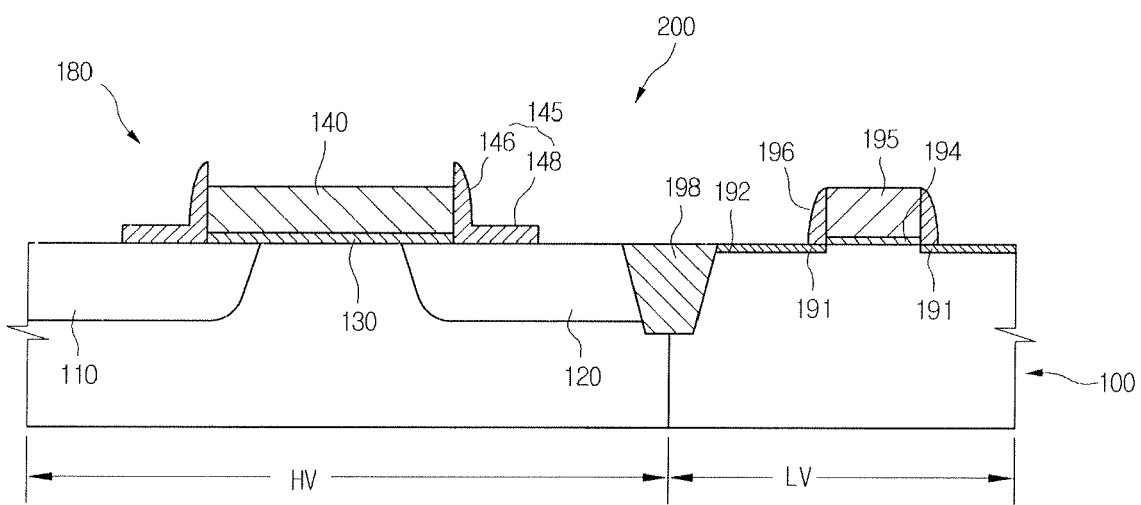

The insulating film 144 is etched using the photoresist pattern 151 as an etch mask. In an embodiment, the insulating film 144 can anisotropically etched by means of plasma so that a high voltage gate spacer 145 is formed in the HV region and a low voltage gate spacer 196 is formed in the LV region as shown in FIG. 6.

At this time, the high voltage gate spacer 145 has a spacer part 146 surrounding a side wall of the high voltage gate electrode 140 and a spacer extending part 148 extended from the spacer part 146. The spacer part 146 is formed to extend higher than the upper surface of the high voltage gate electrode 140.

The spacer extending part 148 extends from the spacer part 146 toward the second conductive type high-concentration source 150 at one side of the gate electrode 140, and extends from the spacer part 146 toward the second conductive type high-concentration drain 160 at the other side of the gate electrode 140 so that a portion of the second conductive type drift region 110 between the high voltage gate electrode 140 and the second conductive type high-concentration source 150 and a portion of the second conductive type drift region 120 between the high voltage gate electrode 140 and the second conductive type high-concentration drain 160 are covered.

Figure 7:
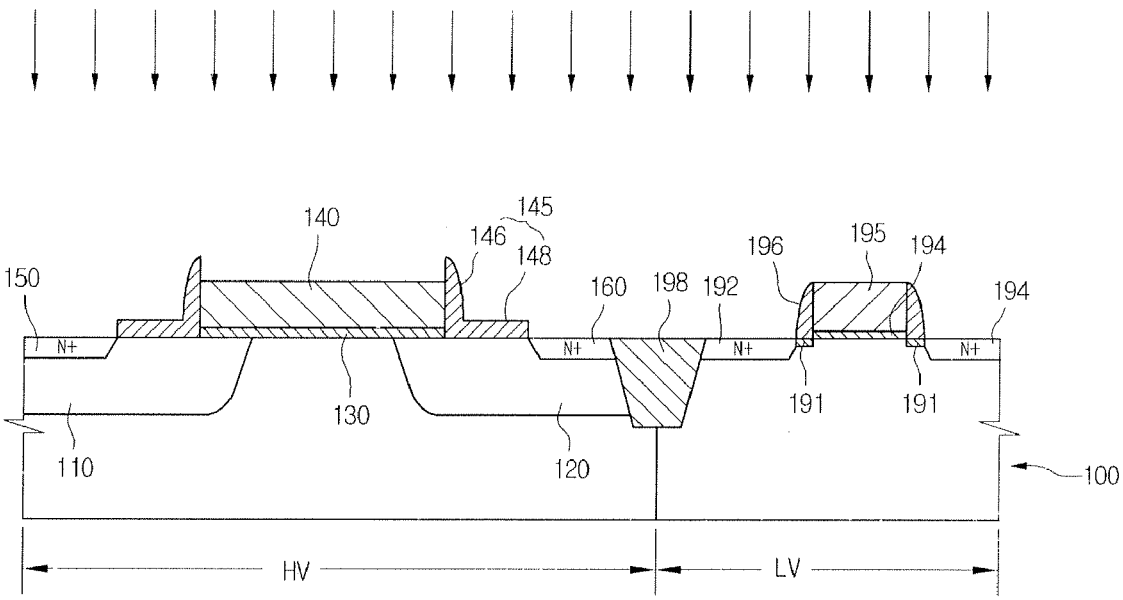

Referring to FIG. 7, after the high voltage gate spacer 145 is formed, a second conductive type element is ion-implanted into the substrate 100 at high concentration to form a second conductive type high concentration source 150 and drain 160 in the second conductive type drift regions 110 and 120, respectively, and a second conductive type high-concentration source 192 and drain 194 in the LV region. The second conductive type element can be an N type element such as phosphorus (P).

Figure 8:
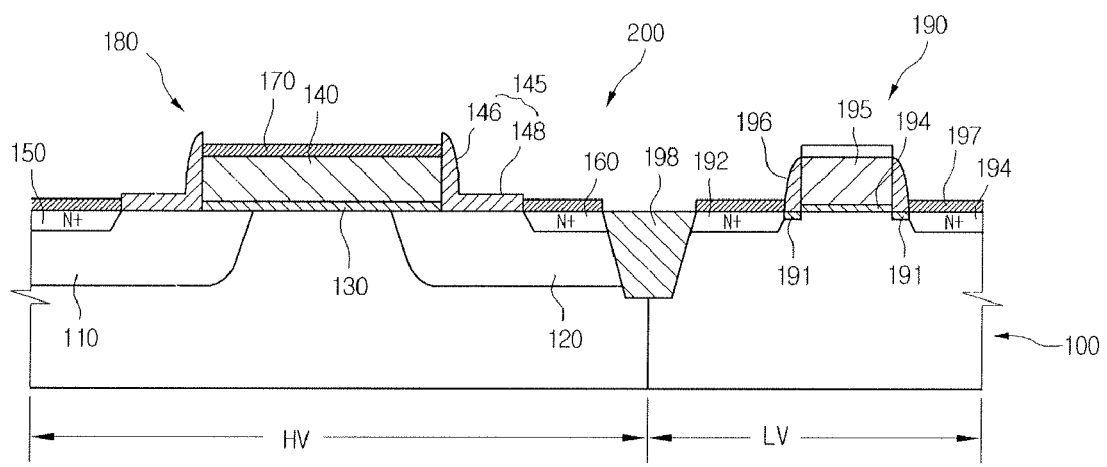

Referring to FIG. 8, after the second conductive type element is ion-implanted on the first conductive type semiconductor substrate 100 at high concentration, a metal film can be formed over the entire area of the upper surface of the first conductive type semiconductor substrate 100. The metal film can be, for example, nickel, titanium, or cobalt.

Subsequently, the metal film can be thermally processed by rapid thermal processing to form silicide 170, 197 where the metal film contacts silicon. Specifically, in the HV region the silicide 170 can be formed on the second conductive type high-concentration source 150, the high voltage gate electrode 140, and the second conductive type high-concentration drain 160. Meanwhile, in the LV region the silicide 197 can be formed on the second conductive type high-concentration source 192 and the second conductive type high-concentration drain 194. Silicide 197 can further be formed on the low voltage gate electrode 195.

As described in the foregoing description, silicide can be formed in a self aligned manner using the gate spacer without a separate silicide blocking pattern using the gate spacer structure of the high voltage semiconductor device 180.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

What is claimed is:

1. A manufacturing method of a high voltage semiconductor device comprising:
forming a first and second drift region of a second conductive type spaced apart from each other on a first conductive type well region of a semiconductor substrate;
forming a gate electrode on a channel region corresponding to a portion of the first conductive well region between the first and second drift regions with a gate insulating film disposed therebetween after the forming of the first and second drift regions;
forming an insulating film on the semiconductor substrate including the first drift region, the second drift region, and the gate electrode;
forming a photoresist pattern on the insulating film covering a first side portion of the gate electrode and extending a first distance on a portion of the first drift region and a second side portion of the gate electrode and extending a second distance on a portion of the second drift region, wherein the insulating film on remaining portions of the semiconductor substrate is exposed;
patterning the insulating film using the photoresist pattern as an etch mask to form a gate spacer having a spacer part at the sides of the gate electrode and a spacer extending part extended from the spacer part the first distance on the first drift region and the second distance on the second drift region;
forming a second conductive type high-concentration source and a second conductive type high-concentration drain by implanting a second conductive type ion in the first and second drift regions, respectively, using the gate spacer as a mask; and
forming a silicide on the second conductive type high-concentration source, and the second conductive high-concentration drain.

2. The method according to claim 1, wherein the first distance is the same as the second distance.

3. The method according to claim 1, wherein forming the suicide comprises:
depositing a metal film on the semiconductor substrate including the second conductive type high-concentration source and the second conductive type high-concentration drain;
performing a thermal process to the deposited metal film; and
removing non-reacted metal film.

4. The method according to claim 3, wherein the metal film is one selected from the group consisting of nickel (Ni), titanium (Ti), and cobalt (Co).

5. The method according to claim 1, wherein the width of the photoresist pattern is 0.4 μm to 0.6 μm from a side wall of the gate electrode.

6. The method according to claim 1, wherein the insulating film is formed to a thickness of 800 Å to 1,200 Å.

7. The method according to claim 1, wherein the insulating film comprises a nitride film and/or an oxide film.

8. The method according to claim 1, further comprising forming a source electrode on the second conductive type high-concentration source and forming a drain electrode on the second conductive type high-concentration drain.

9. A manufacturing method of a semiconductor device having a high voltage region and a low voltage region, comprising:
forming a device isolating layer isolating a high voltage region and a low voltage region on a semiconductor substrate;
forming a first gate insulating film pattern on the semiconductor substrate in the high voltage region and a first gate electrode on the first gate insulating film pattern, and a second gate insulating film pattern on the semiconductor substrate in the low voltage region and a second gate electrode on the second gate insulating film pattern;
forming a lightly doped drain (LDD) region in the low voltage region;
forming an insulating film on the high voltage region and the low voltage region;
forming a photoresist pattern on the insulating film, wherein the photoresist pattern covers one side of the first gate electrode and extending a first distance on a portion of the semiconductor substrate adjacent the one side of the first gate electrode and a second side of the first gate electrode and extending a second distance on a portion of the semiconductor substrate adjacent the second side of the first gate electrode, wherein the insulating film on remaining portions of the semiconductor substrate, including on the device isolating layer, is exposed;
forming a first gate spacer on the first gate electrode and extending the first distance and the second distance on the adjacent portions of the semiconductor substrate and a second gate spacer on the second gate electrode by etching the insulating film using the photoresist pattern as a mask;
forming a first source and drain region in the high voltage region and the second source and drain region in the low voltage region by ion-implanting the semiconductor substrate at high concentration using the first gate spacer and the second gate spacer as a mask;
forming a metal film over the semiconductor substrate; and
forming a silicide on the first source and drain region, the first gate electrode, and the second source and drain region by performing a rapid thermal processing.

10. The method according to claim 9, wherein the metal film is one selected from the group consisting of nickel (Ni), titanium (Ti), and cobalt (Co).

11. The method according to claim 9, wherein a top portion of the first gate spacer extends higher than an tipper surface of the first gate electrode.

12. The method according to claim 9, wherein the thickness of the first gate insulting film pattern is formed thicker than that of the second gate insulating pattern.

13. The method according to claim 9, further comprising forming first and second drift regions spaced apart on the semiconductor substrate of the high voltage region, wherein the first gate electrode is formed on the semiconductor substrate of the high voltage region between the first and second drift regions.

* * * * *